(12) United States Patent
Parkhurst et al.

(10) Patent No.: US 8,390,327 B1
(45) Date of Patent: Mar. 5, 2013

(54) RADIATION-TOLERANT LEVEL SHIFTING

(75) Inventors: Charles Parkhurst, Murphy, TX (US); Mark Hamlyn, Melissa, TX (US)

(73) Assignee: Texas Instruments Incorporated, Dallas, TX (US)

( * ) Notice: Subject to any disclaimer, the term of this patent is extended or adjusted under 35 U.S.C. 154(b) by 21 days.

(21) Appl. No.: 13/214,040

(22) Filed: Aug. 19, 2011

(51) Int. Cl.
*H03K 19/0175* (2006.01)

(52) U.S. Cl. .................. 326/80; 326/9; 326/11; 326/63; 327/333

(58) Field of Classification Search .............. 326/9–14, 326/63, 68, 80–81; 327/333
See application file for complete search history.

(56) References Cited

U.S. PATENT DOCUMENTS

| | | | | |
|---|---|---|---|---|
| 6,127,864 | A * | 10/2000 | Mavis et al. | 327/144 |
| 6,930,527 | B1 * | 8/2005 | Cabanas-Holmen et al. | 327/199 |
| 7,688,112 | B2 * | 3/2010 | Katzman et al. | 326/82 |
| 8,115,515 | B2 * | 2/2012 | Roper | 326/83 |

OTHER PUBLICATIONS

Intersil, "Radiation Hardened Dual, Non-Inverting Power MOSFET Drivers," Data Sheet, File No. 4739.1, Jun. 1999, (2 pages).
DeGregorio, K, "Rad-Hard Reconfigurable Bi-Directional Level Shifter (ReBiLS) for NASA Space Applications in the Flexfet™ 0.18 μm SOI CMOS Technology," 12th NASA Symyposium on VLSI Design, Oct. 4-5, 2005, (7 pages), Coeur d' Alene, Idaho, US.

* cited by examiner

*Primary Examiner* — Jason M Crawford
(74) *Attorney, Agent, or Firm* — Alan A. R. Cooper; Wade J. Brady, III; Frederick J. Telecky, Jr.

(57) ABSTRACT

A system and method for radiation-tolerant level shifting are disclosed. In some embodiments, an integrated circuit may include a plurality of level shifters, where each of the plurality of level shifters configured receive a same logic level in a first voltage domain and to output candidate logic levels in a second voltage domain, and where at least one of the candidate logic levels subject to being different from another one of the candidate logic levels. The integrated circuit may also include a voting circuit coupled to the plurality of level shifters, where the voting circuit is configured to evaluate the candidate logic levels and output a selected logic level based, at least in part, upon the evaluation.

20 Claims, 3 Drawing Sheets

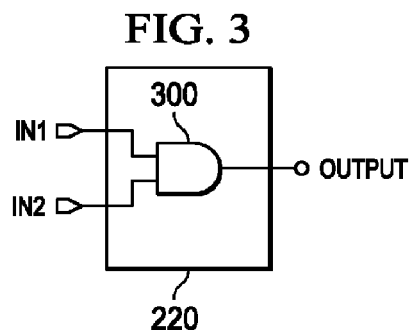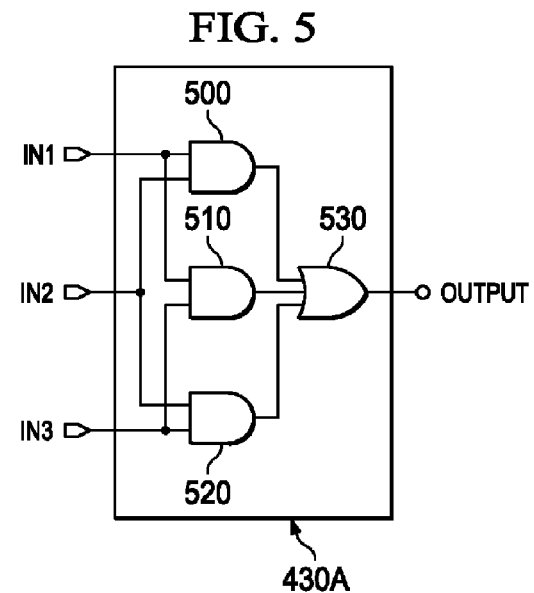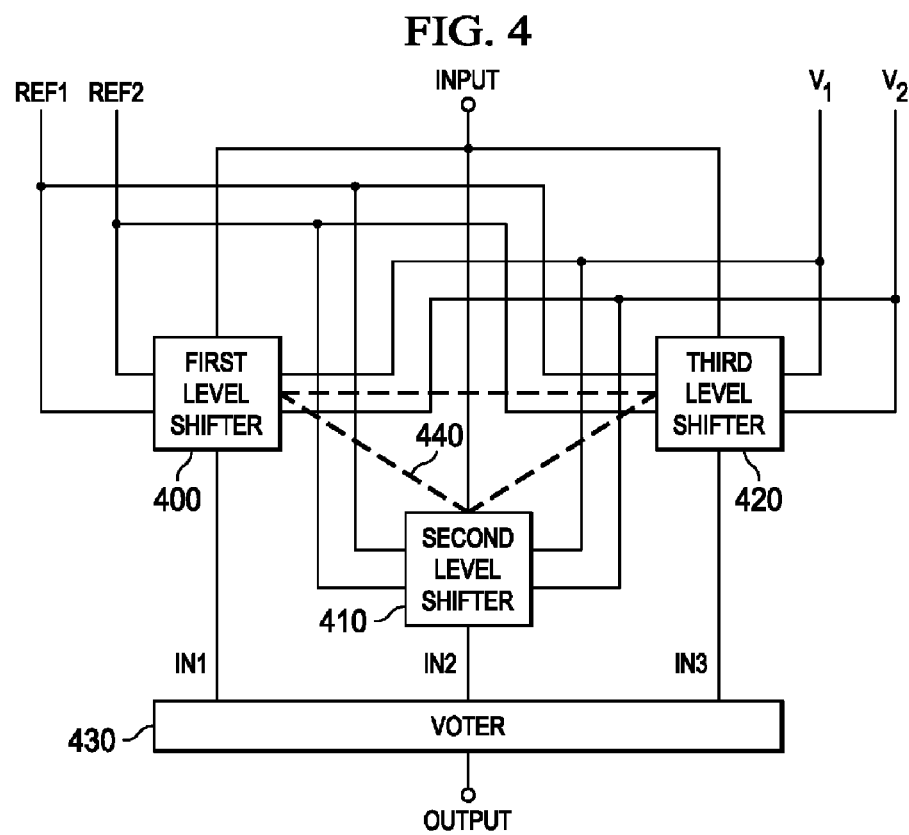

RADIATION-TOLERANT LEVEL SHIFTING

TECHNICAL FIELD

This specification is generally directed to electronics, and, more specifically, to systems and methods for radiation-tolerant level shifting.

BACKGROUND

The outer space has proven to be a harsh environment for electronic circuits. When satellites, space shuttles, space probes, etc. leave the Earth's atmosphere, the electronic equipment they carry becomes subject to levels of ionizing radiation that are much higher than those found near the Earth's surface. These high radiation levels are known to alter logic states of components within integrated circuits, which may in turn lead to performance degradation and even catastrophic failure. Ionizing radiation also presents problems in other environments, such as, for example, nuclear facilities (e.g., due to the presence of radioactive materials), X-ray rooms, particle accelerators, and the like.

Generally speaking, ionizing radiation includes particles and/or electromagnetic waves that contain enough energy to cause electrons to detach from atoms or molecules, thus "ionizing" them. Examples of ionizing particules include alpha particles, beta particles, neutrons, cosmic rays, etc. These types of particles typically have much higher energy than other, lower-level types of radiation, such as visible light, infrared light, radio waves, etc.

In some cases, shielded packaging may be used to protect an integrated circuit from radiation exposure. The effectiveness of a shielded package may vary widely depending upon its particular design, materials, etc. As a rule of thumb, however, better shielding is achieved with heavier, bulkier packaging. In other cases, the physical size of devices (e.g., transistors, etc.) fabricated within the integrated circuit may be increased in an attempt to reduce their sensititivity to radiation. Typically, the larger the size of a device, the better its immunity or tolerance to radiation. Large device sizes, however, also increase capacitance and therefore decrease the speed at which an integrated circuit can operate.

SUMMARY

Systems and methods for radiation-tolerant level shifting are disclosed. In some embodiments, an apparatus may include a first circuit configured to operate in a first voltage domain and a second circuit configured to operate in a second voltage domain different from the first voltage domain. The apparatus may also include a plurality of level shifters coupled to the first circuit, each of the plurality of level shifters configured to receive a data signal from the first circuit in the first voltage domain and to produce a converted data signal in the second voltage domain. In some cases, at least one of the converted data signals may be different from another one of the converted data signals, for example, due to radiation exposure or the like. The apparatus may further include a logic circuit coupled to the plurality of level shifters. The logic circuit may be configured to receive the converted data signals from the plurality of level shifters, determine an output signal based upon a selected number of the converted data signals, and provide the output signal to the second circuit in the second voltage domain.

In some cases, the plurality of level shifters may include three level shifters such that a selected number of converted data signals includes two (or all three) of the converted data signals. Also, at least one of the level shifters may be physically arranged in a non-linear manner (e.g., not in a straight line) with respect to at least two other level shifters. When its design allows for two or more planes (e.g., a three-dimensional layout), at least one of the level shifters may be placed in a different plane than other level shifters. In this manner, a single radiation event may be less likely to affect all level shifters at once.

In an embodiment, the logic circuit may operate in "majority voting" mode and may include, for example, three AND gates and an OR gate coupled to the outputs of the three AND gates. In that case, an output of a first level shifter may be coupled to a first input of a first AND gate and to a first input of a second AND gate, an output of a second level shifter may be coupled to a second input of the first AND gate and to a first input of a third AND gate, and an output of a third level shifter may be coupled to a second input of the second AND gate and a second input of the third AND gate. In a scenario with three level shifters, for example, at least two of the three level shifters (i.e., a majority of the level shifters) may need to indicate a logic level change in order for the output of the logic circuit to also indicate or otherwise confirm the logic level change.

In another embodiment, the logic circuit may operate in "unanimous voting" mode and may include, for example, two AND gates. In that case, the output of the first level shifter may be coupled to a first input of the first AND gate, the output of the second level shifter may be coupled to the second input of the first AND gate, the output of the first AND gate may be coupled to the first input of the second AND gate, and the output of the third level shifter may be coupled to the second input of the second AND gate. In a scenario with three level shifters, for example, all of the three level shifters may need to indicate a logic level change in order for the output of the logic circuit to also indicate or otherwise confirm the logic level change. In some situations, operation in the "unanimous voting" mode may further reduce a circuit's sensitivity to ionizing radiation.

In certain embodiments, the logic circuit may include a programmable circuit. For example, the programmable circuit may be configured to assign a first weight to a first of the converted data signals, a second weight to a second of the converted data signals, and/or a third weight to a third of the converted data signals. Each weight may be different from each other and/or may be a function of the physical placement of the level shifters and their respective sensitivities to radiation events. Moreover, the programmable circuit may be selectably set to operate in a majority voting mode or a unanimous voting mode.

In some embodiments, an integrated circuit may include a plurality of level shifters, each of the plurality of level shifters configured receive a same logic level in a first voltage domain and to output candidate logic levels in a second voltage domain. Also, at least one of the candidate logic levels may be subject to being different from another one of the candidate logic levels, for example, due to radiation exposure. The integrated circuit may also include a voting circuit coupled to the plurality of level shifters, where the voting circuit configured to evaluate the candidate logic levels and output a selected logic level based, at least in part, upon the evaluation.

In other embodiments, a method may include providing an output signal with a first logic level in response to receiving the first logic level from a first and second level shifters coupled to a circuit configured to operate in a first voltage domain, the output signal being in a second voltage domain. The method may also include maintaining the output signal at the first logic level in response to receiving the first logic level from the first level shifter and a second logic level from the second level shifter, the second level shifter being subject to an ionizing radiation event. Additionally or alternatively, the method may include maintaining the output at the first logic level in response to receiving the first logic level from a third level shifter in addition to the receiving the first logic level from the first level shifter. In some cases, the method may further include switching the output to the second logic level in response to receiving the second logic level from the first and second level shifters.

BRIEF DESCRIPTION OF THE DRAWINGS

Figure 1:
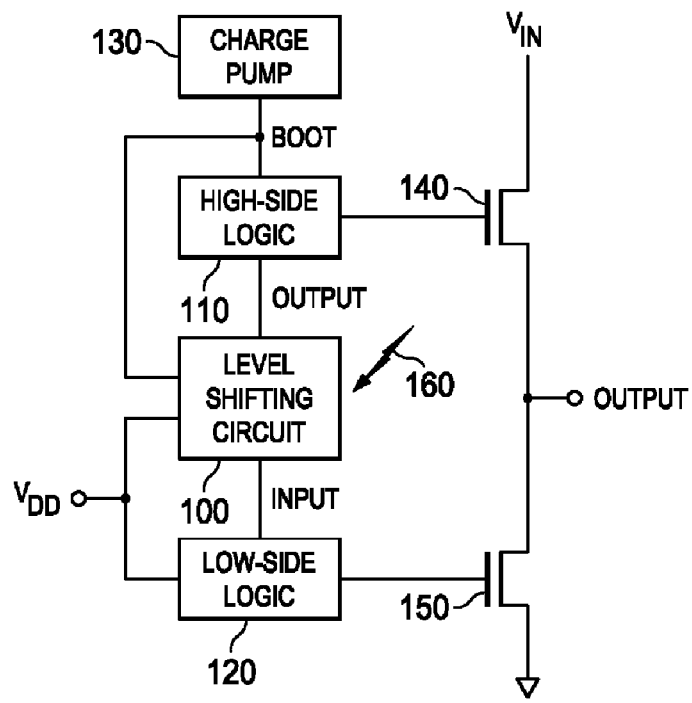

Having thus described the invention(s) in general terms, reference will now be made to the accompanying drawings, wherein:

FIG. 1 is a block diagram of a level shifter within a DC-to-DC converter subject to inonizing radiation according to some embodiments.

Figure 2:
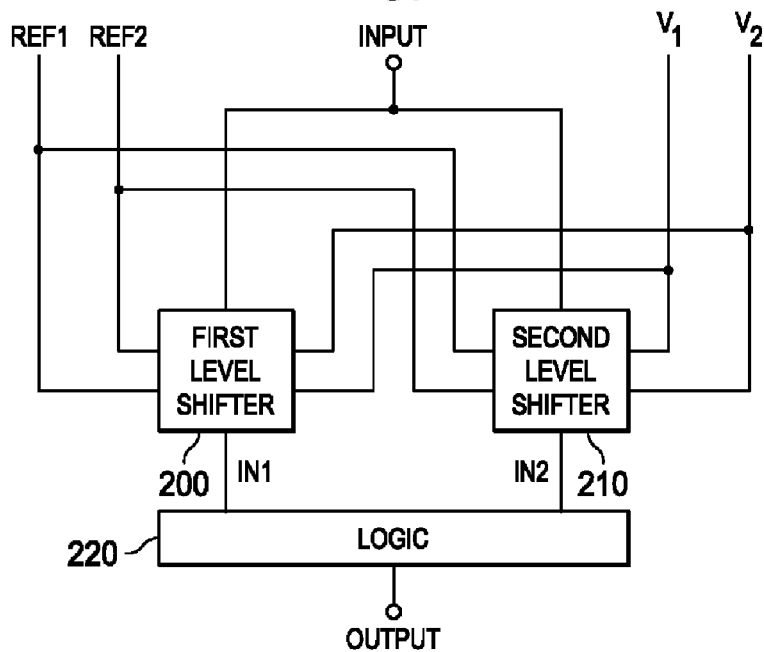

FIG. 2 is a block diagram of a dual level shifting circuit according to some embodiments.

FIG. 3 is a block diagram of a logic circuit according to some embodiments.

FIG. 4 is a block diagram of a triple level shifting circuit according to some embodiments.

FIG. 5 is a block diagram of a voter circuit configured to operate in majority voting mode according to some embodiments.

Figure 6:
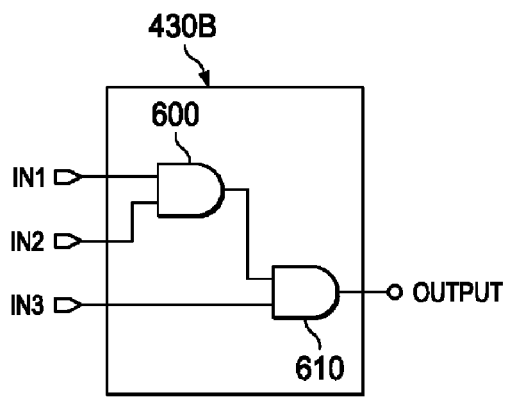

FIG. 6 is a block diagram of a voter circuit configured to operate in unanimous voting mode according to some embodiments.

Figure 7:
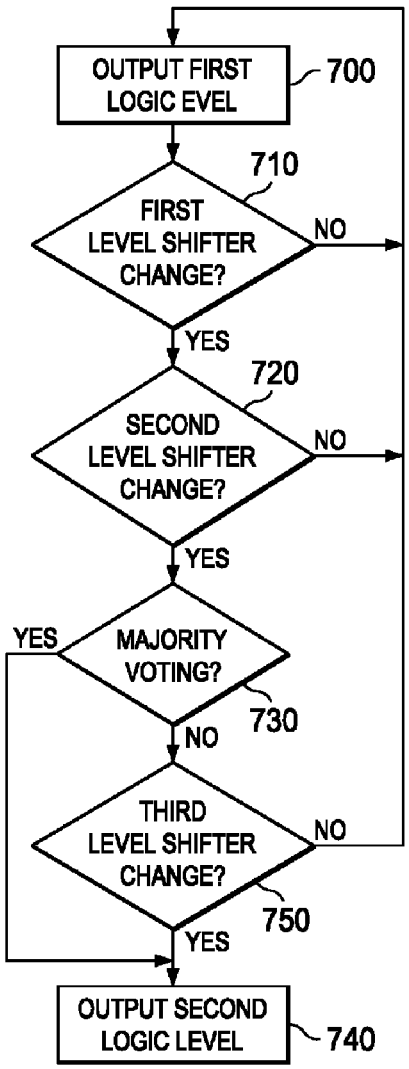

FIG. 7 is a flowchart of a method for performing radiation-tolerant level shifting according to some embodiments.

Figure 8:
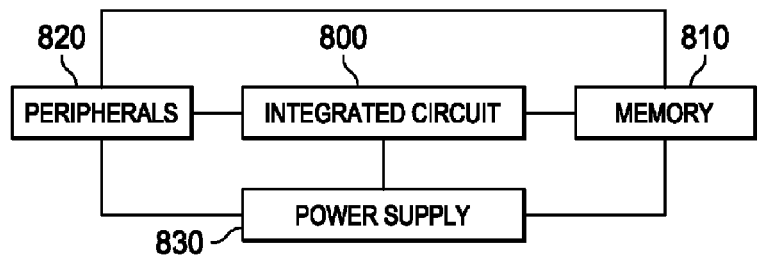

FIG. 8 is a block diagram of system, circuit, or apparatus according to some embodiments.

DETAILED DESCRIPTION

The invention(s) now will be described more fully hereinafter with reference to the accompanying drawings. The invention(s) may, however, be embodied in many different forms and should not be construed as limited to the embodiments set forth herein. Rather, these embodiments are provided so that this disclosure will be thorough and complete, and will fully convey the scope of the invention(s) to a person of ordinary skill in the art. A person of ordinary skill in the art will be able to use the various embodiments of the invention (s).

FIG. 1 is a block diagram of a DC-to-DC converter subject to inonizing radiation 160 according to some embodiments. As illustrated, level shifting circuit 100 is coupled to high-side logic 110 and low-side logic 120. High-side logic 110 is coupled to charge pump 130 and to high-side switch 140. Meanwhile, low-side logic 120 is coupled to low-side switch 150. In some implementations, switches 140 and 150 may include field-effect transistors (FETs) such as, for example, metal-oxide-semiconductor field-effect transistors (MOSFETs), junction field-effect transistors (JFETs), or the like. At a given time, low-side logic may 120 may control low-side switch 150 to output a signal at the OUTPUT pin while high-side logic 110 turns off high-side switch 140. Then, at a subsequent time, high-side logic 120 may cause high-side switch 140 to output a different signal at the OUTPUT pin while low-side logic 120 turns off low-side switch 150. In some cases, a low-pass filter (not shown) may be coupled to the OUTPUT pin to result in a DC voltage at that pin.

Whereas low-side logic 120 operates with a first voltage $V_{DD}$ (i.e., within a first voltage domain), high-side logic 110 operates with a second voltage BOOT (i.e., within a second voltage domain) provided by charge pump 130. In some cases, the second voltage may have a higher value than the first voltage (e.g., BOOT may be 5V and $V_{DD}$ may be 3.3 V, etc.). As such, level shifting circuit 100 may provide an interface for one or more data signals to be communicated from the voltage domain of low-side logic 120 to the voltage domain of high-side logic 110 and vice versa. For example, under normal conditions, if level shifter 100 receives a logic level "1" from low-side logic 120 with a 3.3 V signal, level shifter 100 may then output that same level (i.e., a "1") to high-side logic 110, but the output signal will be a 5V signal.

Generally speaking, however, certain features or devices within level shifting circuit 100, including transistors, resistors, logic gates, etc., as well as connections between these various elements, may be subject to ionizing radiation 160 in some applications. Moreover, it has been discovered that output of level shifting circuit 100 is particularly sensitive to single event upsets 160, due at least in part to its low capacitance nature, which in turn is dictated by operational requirements (e.g., speed). Accordingly, when subject to heavy ions induced by radiation, the output of level shifter 100 may mistakenly or inadvertently provide a logic level (in the second voltage domain) that is different from the logic level of its input (in the first voltage domain).

For example, assume a situation where low-side logic 120 turns low-level switch 150 off and signals high-side logic 110 to turn high-level switch 140 on by sending a data signal through level shifting circuit containing the logic level "1"— which, incidentally, would be in the $V_{DD}$ voltage domain. If a heavy ion strikes level shifting circuit 100, it may cause a different logic level (e.g., a "0" in the BOOT voltage domain) to be output to high-side logic 110, which in turn may be interpreted by high-side logic 110 as a message to keep high-level switch 140 turned off, thus causing an unintended voltage level at the OUTPUT pin of the DC-to-DC converter. Conversely, in some cases, ionizing radiation may cause both high-level switch 140 and low-level switch 150 to be turned on at the same time, thus also creating serious performance issues at the output of the DC-to-DC converter.

In some embodiments, the DC-to-DC converter of FIG. 1 may include any point-of-load DC-to-DC device, such as, for example, plug-in power modules, DC/DC controllers (with external or integrated FETs, inductorless DC/DC regulators, or the like. More generally, however, the DC-to-DC converter of FIG. 1 may be replaced by any device or integrated circuit (e.g., microprocessor, memory, peripheral, interface, etc.) that includes two or more logic blocks operating in different voltage domains. Accordingly, in various applications, level shifting circuit 100 may include any electronic device configured to perform voltage level translation between two or more different voltage domains.

Turning now to FIG. 2, a block diagram of a dual level shifting circuit is depicted according to some embodiments. As shown, two level shifters 200 and 210 are each coupled or connected to a pair of reference voltage levels REF1 and REF2, to a pair of different voltages V1 and V2, and to logic circuit 220. For example, a combination of REF1 and V1 may be used in a first voltage domain and a combination of REF2 and V2 may be used in a second voltage domain. An INPUT signal (also shown in FIG. 1) may arrive in the first voltage domain and be independently translated by each of level shifters 200 and 210. Logic circuit 220 may evaluate the level shifter's respective outputs and provide OUTPUT signal (also shown in FIG. 1) in the second voltage domain.

In the absence of ionizing radiation, each of the first and second level shifters 200 and 210 would generally output the same logic level, and that same logic level would correspond to the logic level received at the INPUT (albeit with a different voltage). For example, if the INPUT contained a logic level "0," both outputs of first and second level shifters 200 and 210 into logic circuit 220 (IN1 and IN2) would contain the same logic level "0." In case one of the first or second level shifters 200 and 210 becomes subject to ionizing radiation, however, those outputs may be different from each other. For example, if second level shifter 201 gets hit by a heavy ion, it may output a logic level "1" while first level shifter 200 may still output the logic level "0." In that case, logic circuit 220 may then make a determination as to which logic level to provide at the OUTPUT, as described in more detail below.

Referring to FIG. 3, a block diagram of logic circuit 220 is depicted according to some embodiments. As shown, logic circuit 220 includes AND gate 300 coupled to the outputs of the first and second level shifters 200 and 210. As such, the output of logic circuit 220 is a logic "1" only if both the outputs of first and second level shifters 200 and 210 (IN1 and IN2) are also "1." Assume, for sake of illustration, that each of first and second level shifters 200 and 210 are outputting a signal having a logic level "0." If second level shifter 210 becomes exposed to ionizing radiation, it will output a logic "1" in error. Nevertheless, logic circuit 220 may also take the output of first level shifter 200 into consideration to correct such an error. As such, AND gate 300 may continue to output the a logic level "0" because the outputs of the first and second level shifters 200 and 210 have not both been affected by the radiation.

In the embodiment shown in FIG. 2, it is possible for a single event upset to affect both level shifters 200 and 210. For instance, if an ion travels in a straight line, as is often the case, then the same ion may hit both level shifter 200 and level shifter 210. In part to address this concern, FIG. 4 shows a block diagram of a triple level shifting circuit according to some embodiments. As shown, three level shifters 400-420 are coupled to the same two voltage domains in a manner similar to that described with respect to FIG. 3. Furthermore, each of level shifters 400-420 is coupled to voter circuit 430, described in more detail below in connection with FIGS. 5 and 6. As with logic circuit 320, here voter circuit 430 may determine, based on the various possible outputs of level shifters 400-420 (IN1, IN2, and IN3), which logic level to output.

In some embodiments, at least one of level shifters 400-420 may be physically arranged in a non-linear manner with respect to the others. For example, level shifters 400-420 may be arranged or laid out at the vertices of triangle 440 so as to avoid having all three level shifters 400-420 along a single straight line (and therefore potentially subject to the same event upset). In some cases, other types of geometric shapes may be used to distribute level shifters 400-420. Additionally or alternatively, one or more of level shifters 400-420 may be arranged in a different plane of an integrated circuit (e.g., on different layers of silicon in a three-dimensional design) for similar reasons.

In certain embodiments, voter circuit 430 may operate in majority voting mode or unanimous voting mode. FIG. 5 is a block diagram of voter circuit 430 configured to operate in majority voting mode according to some embodiments. In particular, voter circuit 430A includes first AND gate 500, second AND gate 510, third AND gate 520, and OR gate 530. OR gate 530 is coupled to the outputs of first, second, and third AND gates 500-520. Moreover, the output of first level shifter 400 is coupled to a first input of first AND gate 500 and to a first input of second AND gate 510. The output of second level shifter 410 is coupled to a second input of first AND gate 500 and to a first input of third AND gate 520. And the output of third level shifter 420 is coupled to a second input of second AND gate 510 and a second input of third AND gate 520.

In operation, voter circuit 430A may output a logic level "1" if at least two of level shifters 400-420 also indicate that logic level—i.e., a majority of the level shifters. If, on the other hand, less than a majority of the level shifters indicates a logic level "1"—i.e., one or none of level shifter 400-420—then voter circuit 430A may output a logic level "0."

In contrast with voter circuit 430A, voter circuit 430B of FIG. 6 is configured to operate in unanimous voting mode according to some embodiments. Here, voter circuit 430B includes first AND gate 600 and second AND gate 610. As illustrated, the output of first level shifter 400 is coupled to a first input of first AND gate 600 and the output of second level shifter 410 is coupled to a second input of first AND gate 600. Further, the output of first AND gate 600 is coupled to a first input of second AND gate 610 and the output of third level shifter 420 is coupled to a second input of second AND gate 610. In this manner, voter circuit 430 may output a logic level "1" only if all three level shifters indicate that logic level. The probability of all three level shifters having an ion strike is considered low, especially when the level shifters are physically spaced within the integrated circuit.

The embodiments shown in FIGS. 5 and 6 are for illustrative purposes only. It should be understood that certain variations may be implemented to achieve similar results. As an example, OR gate 530 may be replaced with a NOR gate in FIG. 5 to provide the same "majority voting" operation(s). As another example, AND gates 600 and 610 may be replaced by a single, three-input AND gate in FIG. 6 to provide a similar "unanimous voting" operation.

In some implementations, voting circuit 430 may be a programmable circuit or logic device such as, for example, a programmable logic array, a field-programmable gate array (FPGA), or the like. As such, voting circuit 430 may be configured to operate in a majority voting mode (e.g., as voting circuit 430A of FIG. 5) and/or in a unanimous voting mode (e.g., as voting circuit 430B of FIG. 6), as selected by a user.

In cases where a particular level shifter is deemed to be extra sensitive to radiation at least in part due to the integrated circuit's layout (i.e., due to its physical location within the integrated circuit, etc.), voting circuit 430 may be configured to assign a different weight to that level shifter's output (e.g., half or a third of the weight assigned to other level shifters). In some embodiments, level shifter weights may be assigned in a manner that avoids a "tie" situation. For example, if the outputs of two level shifters were assigned ½ the weight of the output of a third level shifter, and if these two level shifters both indicated a same output that is different from an output of the third level shifter, voting circuit 430 would be faced with a tie. To avoid this scenario, in some cases voting circuit 430 may assign a different weight to each level shifter. Moreover, these different level shifter weights may be selected based at least in part upon the physical distances among the level shifters (e.g., weights may be directly or inversely proportional to the distances between the devices).

FIG. 7 is a flowchart of a method for performing radiation-tolerant overcurrent detection according to some embodiments. This particular method is illustrated with reference to the system described in FIG. 4 using three level shifters, although the same method may be readily adapted to accommodate other systems or circuits with any number of level shifters. At block 700, the method may output a signal having a first logic level (e.g., "0"). At block 710, the method may determine whether a first level shifter has output a second logic level (e.g., a "1"). The first level shifter change may be deemed a "candidate" event insofar as, at this point, it has not been determined whether the change is due to a change at the input of a level shifter or due to an error resulting from ionizing radiation, etc. If the first level shifter has outputted the second logic level, control passes to block 720; otherwise, control returns to block 700. At block 720, the method may determine whether a second level shifter has also outputted the second logic level. If so, control passes to block 730; otherwise, control returns to block 700.

At block 730, the method may determine whether a majority voting mode has been selected. If so, then at block 740 the method may output the second logic level (e.g., two out of three level shifters have outputed the second logic level). Otherwise, it may be implied that the current mode of operation is unanimous voting, and block 750 may determine whether the third level shifter has also outputted the second logic level. If so, block 740 may output the second logic level (e.g., three out of three level shifters have outputed the second logic level); otherwise, control returns to block 700.

In some cases, the operations shown in FIG. 7 may be performed by voting circuit 430. It will be understood that blocks 700-740 of the process illustrated in FIG. 7 may be executed simultaneously and/or sequentially. It will be further understood that each operation may be performed in any order and may be performed once or repetitiously.

Turning now to FIG. 8, a system, circuit, or apparatus incorporating at least one instance of integrated circuit 800 is depicted according to some embodiments. In some cases, integrated circuit 800 may be a system-on-chip (SoC), application specific integrated circuit (ASIC), microprocessor, etc. As illustrated, integrated circuit 800 (e.g., a processor or the like) is coupled to one or more peripherals 820 and external memory 810. Power supply 830 is also provided which supplies the supply voltages to integrated circuit 800 as well as one or more supply voltages to memory 810 and/or peripherals 820, and may include any battery or other electric energy source.

In some embodiments, integrated circuit 800, memory 810, and/or peripherals 820 may use power supply 830 to feed an internal DC-to-DC converter, power source, amplifier, and/or regulator, which in turn may employ a plurality of level shifters in combination with one or more logic or voting circuits to serve as an interface between a high-side logic circuit and a low-side logic circuit as described with respect to FIGS. 1-6. Additionally or alternatively, integrated circuit 800, memory 810, and/or peripherals 820 may include any electrical or electronic circuit with logic blocks operating in two or more different voltage domains, and the plurality of level shifters and voting circuit(s) may provide an interface among those voltage domains. Moreover, in some embodiments, more than one instance of integrated circuit 800, memory 810, and/or peripherals 820 may be included in a same system or apparatus.

Peripherals 820 may include any desired circuitry, depending on the type of system. In certain types of space applications, for instance, the system of FIG. 8 may be a sattellite system (e.g., part of a global-positioning satellite or GPS) or the like, and peripherals 820 may include devices for various types of sattellite communications, such as, for example, radio communications or the like. Generally speaking, however, the system of FIG. 8 may be implemented in any type of computing or electronic system such as, for example, desktop and laptop computers, tablets, network appliances, mobile phones, personal digital assistants, e-book readers, televisions, game consoles, etc. Accordingly, peripherals 820 may include any type of device including, for example, interface devices such as a display screen, including touch display screens or multi-touch display screens, keyboard or other input devices, microphones, speakers, etc., devices for various types of communication, such as Wi-Fi™, Bluetooth®, cellular, etc.

External memory 810 may include any type of memory. For example, external memory 810 may include SRAM, non-volatile RAM (NVRAM, such as "flash" memory), and/or dynamic RAM (DRAM) such as synchronous DRAM (SDRAM), double data rate (DDR, DDR2, DDR3, etc.) SDRAM, etc. External memory 810 may include one or more memory modules to which the memory devices are mounted, such as single inline memory modules (SIMMs), dual inline memory modules (DIMMs), etc.

Many of the operations described herein may be implemented in hardware, software, and/or firmware, and/or any combination thereof. When implemented in software, code segments perform the necessary tasks or operations. The program or code segments may be stored in a processor-readable, computer-readable, or machine-readable medium. The processor-readable, computer-readable, or machine-readable medium may include any device or medium that can store or transfer information. Examples of such a processor-readable medium include an electronic circuit, a semiconductor memory device, a flash memory, a ROM, an erasable ROM (EROM), a floppy diskette, a compact disk, an optical disk, a hard disk, a fiber optic medium, etc.

The software code segments may be stored in any volatile or non-volatile storage device, such as a hard drive, flash memory, solid state memory, optical disk, CD, DVD, computer program product, or other memory device, that provides tangible computer-readable or machine-readable storage for a processor or a middleware container service. In other embodiments, the memory may be a virtualization of several physical storage devices, wherein the physical storage devices are of the same or different kinds. The code segments may be downloaded or transferred from storage to a processor or container via an internal bus, another computer network, such as the Internet or an intranet, or via other wired or wireless networks.

Many modifications and other embodiments of the invention(s) will come to mind to a person of ordinary skill in the art to which the invention(s) pertain having the benefit of the teachings presented in the foregoing descriptions, and the associated drawings. Therefore, it is to be understood that the invention(s) are not to be limited to the specific embodiments disclosed. Although specific terms are employed herein, they are used in a generic and descriptive sense only and not for purposes of limitation.

The invention claimed is:

1. An apparatus comprising:
   a first circuit configured to operate in a first voltage domain;
   a second circuit configured to operate in a second voltage domain different from the first voltage domain;
   a plurality of level shifters coupled to the first circuit, each of the plurality of level shifters configured to receive a data signal from the first circuit in the first voltage domain and to produce a converted data signal in the second voltage domain, wherein at least one of the converted data signals is different from another one of the converted data signals; and
   a logic circuit coupled to the plurality of level shifters, the logic circuit configured to receive the converted data signals from the plurality of level shifters, determine an output signal based upon a selected number of the converted data signals, and provide the output signal to the second circuit in the second voltage domain.

2. The apparatus of claim 1, wherein the plurality of level shifters includes a first level shifter, a second level shifter, and a third level shifter, and wherein the selected number of the converted data signals includes two or more of the converted data signals.

3. The apparatus of claim 2, wherein the logic circuit further includes a first AND gate, a second AND gate, a third AND gate, and an OR gate coupled to: an output of the first AND gate, an output of the second AND gate, and an output of the third AND gate.

4. The apparatus of claim 3, wherein an output of the first level shifter is coupled to a first input of the first AND gate and to a first input of the second AND gate, an output of the second level shifter is coupled to a second input of the first AND gate and to a first input of the third AND gate, and an output of the third level shifter is coupled to a second input of the second AND gate and a second input of the third AND gate.

5. The apparatus of claim 2, wherein the logic circuit further includes a first AND gate and a second AND gate.

6. The apparatus of claim 5, wherein an output of the first level shifter is coupled to a first input of the first AND gate, an output of the second level shifter is coupled to a second input of the first AND gate, an output of the first AND gate is coupled to a first input of the second AND gate, and an output of the third level shifter is coupled to a second input of the second AND gate.

7. The apparatus of claim 1, wherein at least one of the plurality of level shifters is physically arranged in a non-linear manner with respect to at least two other ones of the plurality of level shifters.

8. The apparatus of claim 1, wherein the logic circuit includes a programmable circuit.

9. The apparatus of claim 8, wherein the programmable circuit is configured to assign a first weight to a first of the converted data signals and a second weight to a second of the converted data signals, wherein the first weight is different from the second weight.

10. The apparatus of claim 8, wherein the programmable circuit is selectable to operate in a majority voting mode or a unanimous voting mode.

11. An integrated circuit comprising:
a plurality of level shifters, each of the plurality of level shifters configured receive a same logic level in a first voltage domain and to output candidate logic levels in a second voltage domain, at least one of the candidate logic levels subject to being different from another one of the candidate logic levels; and
a voting circuit coupled to the plurality of level shifters, the voting circuit configured to evaluate the candidate logic levels and output a selected logic level based, at least in part, upon the evaluation.

12. The integrated circuit of claim 11, wherein at least one of the plurality of level shifters detectors is disposed within the integrated circuit in a non-linear manner with respect to two or more of the plurality of level shifters.

13. The integrated circuit of claim 12, wherein the at least one of the candidate logic levels is received in error due, at least in part, to ionizing radiation exposure.

14. The integrated circuit of claim 11, wherein the plurality of level shifters includes a first level shifter, a second level shifter, and a third level shifter, and wherein the voting circuit further includes a first AND gate, a second AND gate, a third AND gate, and an OR gate coupled to an output of the first AND gate, an output of the second AND gate, and an output of the third AND gate.

15. The integrated circuit of claim 14, wherein an output of the first level shifter is coupled to a first input of the first AND gate and to a first input of the second AND gate, an output of the second level shifter is coupled to a second input of the first AND gate and to a first input of the third AND gate, and an output of the third level shifter is coupled to a second input of the second AND gate and a second input of the third AND gate.

16. The integrated circuit of claim 11, wherein the plurality of level shifters includes a first level shifter, a second level shifter, and a third level shifter, and wherein the voting circuit includes a first AND gate and a second AND gate.

17. The integrated circuit of claim 16, wherein an output of the first level shifter is coupled to a first input of the first AND gate, an output of the second level shifter is coupled to a second input of the first AND gate, an output of the first AND gate is coupled to a first input of the second AND gate, and an output of the third level shifter is coupled to a second input of the second AND gate.

18. A method comprising:
providing an output signal with a first logic level in response to receiving the first logic level from a first and second level shifters coupled to a circuit configured to operate in a first voltage domain, the output signal being in a second voltage domain;
maintaining the output signal at the first logic level in response to receiving the first logic level from the first level shifter and a second logic level from the second level shifter, the second level shifter being subject to an ionizing radiation event.

19. The method of claim 18, further comprising:
maintaining the output at the first logic level in response to receiving the first logic level from a third level shifter in addition to the receiving the first logic level from the first level shifter.

20. The method of claim 18, further comprising:
switching the output to the second logic level in response to receiving the second logic level from the first and second level shifters.

* * * * *